United States Patent
Nakamura et al.

(10) Patent No.: US 9,123,795 B2
(45) Date of Patent: Sep. 1, 2015

(54) METHOD OF MANUFACTURING SEMICONDUCTOR WAFERS

(71) Applicants: Fujikoshi Machinery Corp., Nagano-shi, Nagano (JP); NATIONAL INSTITUTE OF ADVANCED INDUSTRIAL SCIENCE AND TECHNOLOGY, Tokyo (JP)

(72) Inventors: Yoshio Nakamura, Nagano (JP); Daizo Ichikawa, Nagano (JP); Haruo Sumizawa, Nagano (JP); Shiro Hara, Tsukuba (JP); Sommawan Khumpuang, Tsukuba (JP); Shinichi Ikeda, Tsukuba (JP)

(73) Assignees: FUJIKOSHI MACHINERY CORP., Nagano (JP); NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 0 days.

(21) Appl. No.: 14/087,883

(22) Filed: Nov. 22, 2013

(65) Prior Publication Data

US 2014/0154870 A1    Jun. 5, 2014

(30) Foreign Application Priority Data

Dec. 4, 2012    (JP) .................................. 2012-265687

(51) Int. Cl.
*H01L 21/00* (2006.01)
*H01L 21/78* (2006.01)

(52) U.S. Cl.
CPC ...................................... *H01L 21/78* (2013.01)

(58) Field of Classification Search
CPC ......................................................... H01L 21/78
USPC ........................................................... 438/462
See application file for complete search history.

(56) References Cited

U.S. PATENT DOCUMENTS

| 2005/0153522 A1* | 7/2005 | Hwang et al. ................. 438/455 |
| 2006/0014383 A1* | 1/2006 | Otsuki et al. .................. 438/680 |
| 2008/0057680 A1* | 3/2008 | Watanabe ...................... 438/463 |

FOREIGN PATENT DOCUMENTS

JP    2005-33190 A    2/2005

* cited by examiner

*Primary Examiner* — Bradley K Smith
(74) *Attorney, Agent, or Firm* — Birch, Stewart, Kolasch & Birch, LLP

(57) ABSTRACT

A method of manufacturing semiconductor wafers which facilitates formation of orientation flat lines and allows beveling work without problems. The method of manufacturing semiconductor wafers includes steps wherein a plurality of small-diameter wafers is cut out from a large-diameter semiconductor wafer, the method including: a marking step of forming straight groove-like orientation flat lines by a laser beam so as to cross the respective small-diameter wafers in each row in the large-diameter semiconductor wafer, wherein cutout positions of the small-diameter wafers are aligned in rows in a specific direction, collectively for each of the rows; and a cutting step of cutting out the small-diameter wafers separately from the large-diameter semiconductor wafer, by a laser beam, after the marking step, in such a way that the orientation flat lines are located at required positions in the small-diameter wafers to be obtained.

12 Claims, 3 Drawing Sheets

METHOD OF MANUFACTURING SEMICONDUCTOR WAFERS

CROSS-REFERENCE TO RELATED APPLICATION

This application is based upon and claims the benefit of priority of the prior Japanese Patent Application No. P2012-265687, filed on Dec. 4, 2012, and the entire contents of which are incorporated herein by reference.

BACKGROUND

1. Field

The present invention relates to a method of manufacturing semiconductor wafers.

2. Description of the Related Art

In manufacturing semiconductor devices, in order to enable mass production thereof, the diameter of wafers is continuously increased, and even a very large diameter wafer with a diameter of 300 mm or more has emerged. Productivity is enhanced by performing a series of steps in which this large-diameter wafer successively undergoes necessary processes such as polishing, cleaning, drying, CVD, exposure, development and etching, and finally is cut into single pieces. Collectively performing such a series of steps requires a large-scale production facility in the order of hundreds of billions of yen.

However, in recent years, a wide variety of semiconductor apparatuses are also increasingly needed in small quantities for various uses. The above-mentioned large-scale production facility is unsuitable for such limited production of a wide variety of semiconductor apparatuses.

Therefore, recently, a minimal (registered trademark) fab concept has been proposed in which necessary processing treatments are performed on a small wafer with a diameter of about one-half inch (about a size which provides one semiconductor chip). According to this minimal fab concept, a small processing apparatus such as a polishing apparatus, a CVD apparatus is provided for each step so that these processing apparatuses are used in appropriate combination as necessary, thereby making it possible to deal with a wide variety of wafers. As each apparatus may be small, it is possible to suppress the capital-investment spending.

In the above minimal fab concept, it is not contemplated in the foreseeable future to pull up a small-diameter silicon monocrystalline with a diameter of about one-half inch, but rather it is assumed to cut out one-half inch size small-diameter silicon wafers from a current large-diameter silicon wafer.

By the way, also in the past, a patent literature 1 has described cutting out a plurality of small-diameter wafers from a large-diameter semiconductor wafer.

CITATION LIST

Patent Literature

Patent Literature 1: JP 2005-33190 A

SUMMARY

Technical Problem

The Patent Literature 1 describes, for example, cutting out three or more small-diameter wafers with a diameter of equal to or greater than two inches from a large-diameter wafer with a diameter of equal to or greater than four inches, cutting out four or more small-diameter wafers with a diameter of equal to or greater than two inches from a large-diameter wafer with a diameter of equal to or greater than five inches, and cutting out seven or more small-diameter wafers with a diameter of equal to or greater than two inches from a large-diameter wafer with a diameter of equal to or greater than six inches. Further, it describes that this cutout is performed using a laser beam, etc., and additionally, orientation flats are also provided by cutout at the same time.

By the way, the wafer size used for the minimal fab concept is one with a small diameter of about one-half inch as described above. There is a problem that, in such a small-diameter wafer, if an orientation flat or a notch is provided in its outer periphery by cutout, the orientation flat portion or notch portion cannot be beveled well in a beveling step of the assembly and testing process.

The present invention was made to solve the above-described problem. It is an object of the present invention to provide a method of manufacturing semiconductor wafers which facilitates formation of orientation flat lines while also allowing beveling work without problems.

Solution to Problem

To achieve the above object, the present invention includes the following configuration.

Namely, the method of manufacturing semiconductor wafers according to the present invention is a method of manufacturing semiconductor wafers, in which a plurality of small-diameter wafers is cut out from a large-diameter semiconductor wafer, the method including: a marking step of forming straight groove-like orientation flat lines by a laser beam so as to cross the respective small-diameter wafers in each row in the large-diameter semiconductor wafer, wherein cutout positions of the small-diameter wafers are aligned in rows in a specific direction, collectively for each of the rows; and a cutting step of cutting out the small-diameter wafers separately from the large-diameter semiconductor wafer by a laser beam after the marking step.

The method has a lapping step of lapping the large-diameter semiconductor wafer so as to have a required thickness, and it is possible to perform the marking step and subsequent steps after the lapping step.

Moreover, it is preferable that the straight groove-like orientation flat lines are formed so that both ends thereof reach an edge of the small-diameter wafers to be cut out.

It is preferable that positions of the straight orientation flat lines are determined based on an orientation flat or a notch of the large-diameter semiconductor wafer.

Moreover, one-half inch size small-diameter wafers are cut out.

Moreover, the method further includes: an outside diameter finishing step of finishing the cut out small-diameter wafer so as to have a required outside diameter; a beveling step of beveling an outer periphery of the small-diameter wafer into a predefined shape; an etching step of etching the beveled small-diameter wafers; a mirror beveling step of mirror processing a beveled portion of the beveled small-diameter wafer, using a finishing grinding stone; a polishing step of mirror processing the mirror-beveled small-diameter wafers; and a precision cleaning step of cleaning the wafers contaminated through polishing.

It is preferable that the outside diameter finishing step and the beveling step are performed at the same time with the same grinding stone using a beveling apparatus.

Advantageous Effects of Invention

The present invention facilitates formation of orientation flat lines in small-diameter wafers, while also allowing beveling work without problems because the orientation flat lines have been provided on the wafer surfaces.

DESCRIPTION OF THE PREFERRED EMBODIMENTS

Preferred embodiments of the present invention will be described below in detail with reference to the accompanying drawings.

Figure 1:
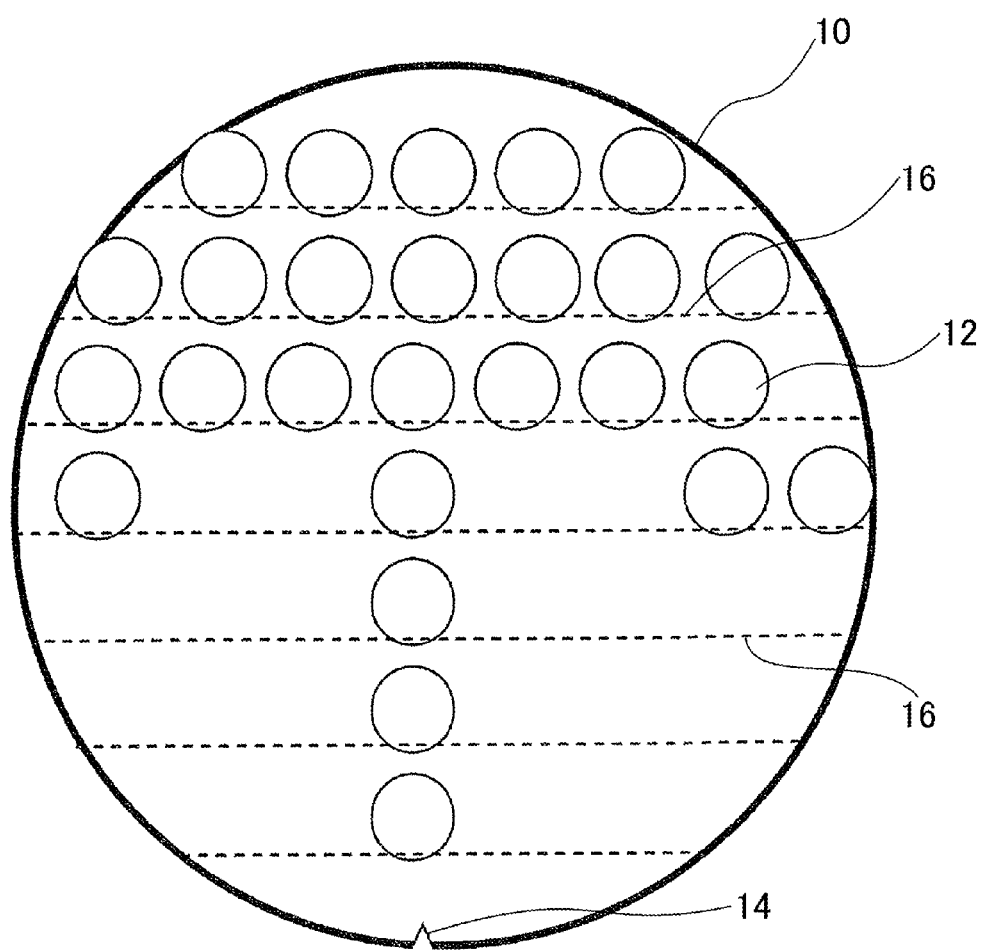
FIG. 1 is a schematic diagram showing an example of a cutout pattern along which to cut out small-diameter wafers from a large-diameter wafer by a laser beam.
Figure 2:
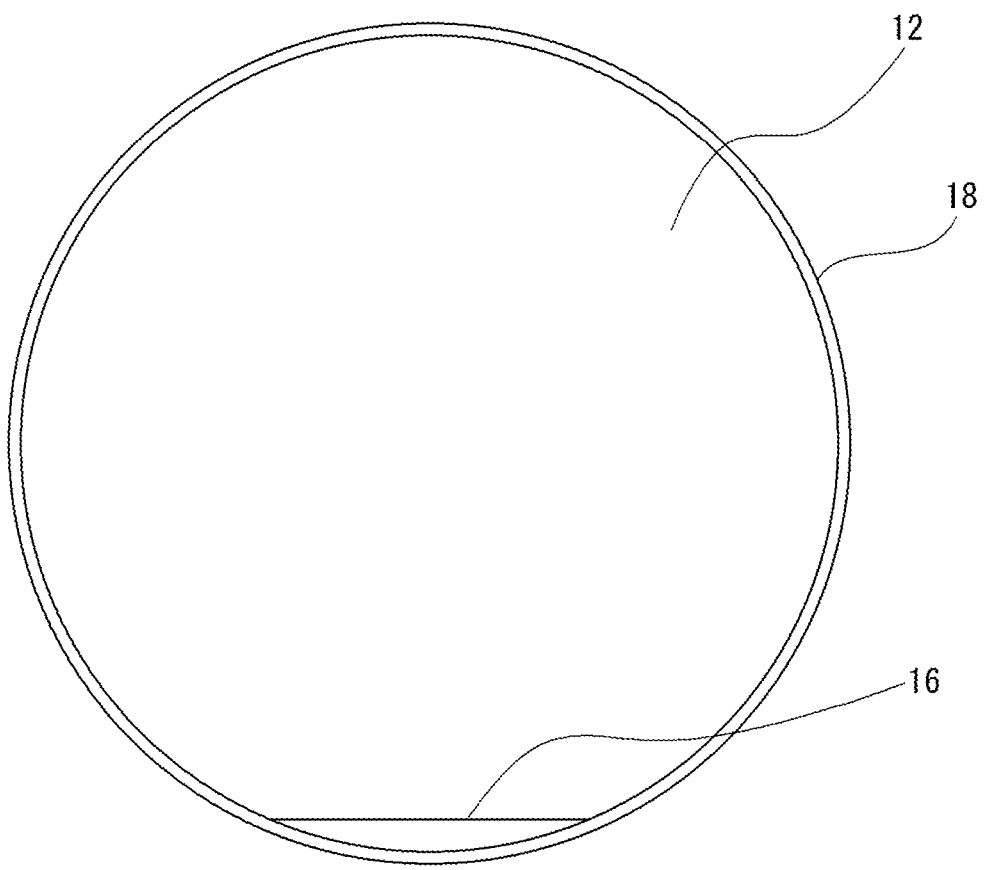
FIG. 2 is a plan view showing a cut out small-diameter wafer 12.

FIG. 1 is a schematic diagram showing an example of a cutout pattern along which to cut out small-diameter wafers 12 from a large-diameter wafer 10 by a laser beam. FIG. 2 is a plan view showing a cut out small-diameter wafer 12.

The large-diameter wafer 10 is one with a diameter of 200 mm or 300 mm, for example. This large-diameter wafer 10, which is manufactured by a conventional manufacturing method, that is, manufactured through the following steps: pulling up of a monocrystalline→outer periphery grinding→notch formation→slicing→beveling→lapping→etching→polishing→precision cleaning, etc., may be any wafer having a notch 14 or an orientation flat formed therein.

The notch 14 is formed at a required position such that, for example, a line connecting the notch 14 and the center of the wafer 10 runs perpendicular to the plane orientation of the surface of the wafer 10. In addition, also in the case of the orientation flat, it is formed at a certain required position such that, for example, the orientation flat is oriented parallel or perpendicular to the plane orientation of the wafer 10.

Both the notch 14 and the orientation flat are used for alignment (positioning) of the wafer 10, etc. in each processing step of many processing steps performed on the wafer 10 to complete it as a semiconductor device.

Conventionally, the large-diameter wafer 10 is formed with a thickness of 700 to 1000 μm in order to facilitate handling during many processing steps. In fact, this level of thickness is required from the strength point of view. Then, in the final stage to perform necessary processing steps for formation of semiconductor devices, it is lapped down so as to have a thickness of 200 to 250 μm, for example, and finally, cut into single pieces to be completed as semiconductor devices.

In contrast to this, the present embodiment uses the wafer 10 which has been lapped down from the start so as to have a thickness of about 350 μm by performing lapping process on the large-diameter wafer 10. The lapping step can be performed using a conventional double side lapping apparatus.

In the present embodiment, the large-diameter wafer 10 is cut into small-diameter wafers 12 with a diameter of about one-half inch in the first stage, and necessary processing steps are performed thereafter, as described below. Lapping of the large-diameter wafer 10 into a thin wafer with a thickness of about 350 μm allows for easy cutout by a laser beam. Furthermore, since the small-diameter wafers 12 are cut out with a diameter of about one-half inch, the ratio of the thickness to the diameter is larger than that of the large-diameter wafer 10, so that they will not suffer warping, etc. in spite of their thinness, and will not suffer cracking, etc. in the assembly and testing process.

In the present embodiment, prior to cutting out the large-diameter wafer 10 into the small-diameter wafers 12, straight groove-like orientation flat lines 16 are firstly formed in the large-diameter wafer 10 by a laser beam so that they are located at required positions in the small-diameter wafers 12 to be obtained, as shown by dashed lines in FIG. 1.

Solid lines in FIG. 1 show imaginary positions of the small-diameter wafers 12 to be cut out.

As shown in FIG. 1, the cutout positions of the small-diameter wafers align in rows in a specific direction in the large-diameter semiconductor wafer, and the orientation flat line 16 is formed collectively for each row by a laser beam so that it crosses every small-diameter wafer in each row. In fact, the orientation flat line 16 is formed collectively for each row by moving a laser apparatus (not shown) in the row direction.

It is preferable to form the orientation flat line 16 as a single seamless straight line in the large-diameter wafer 10 for each row unless it interferes with the small-diameter wafer to be cut out in the adjacent row, because this facilitates control of laser beam irradiation by the laser apparatus.

It should be noted that the straight groove may cross over the small-diameter wafer in the adjacent row depending on arrangement of the small-diameter wafers to be cut out, and in that case, the orientation flat lines 16 may be formed only in necessary parts in the small-diameter wafers 12 for each row. It should be noted that, even in this case, the orientation flat lines 16 are provided so that both ends thereof reach the edge of the small-diameter wafers 12. This allows detection of the positions of both the ends of the orientation flat lines 16 at the edge of the wafers 12 by means of a sensor in the assembly and testing process, thereby facilitating alignment of the wafers 12.

The orientation flat lines 16 are positioned and oriented, based on the notch 14 (or the orientation flat) previously provided in the large-diameter wafer 10, so that they extend in a required direction. For example, in FIG. 1, the orientation flat lines 16 in the respective rows are formed in parallel to each other, perpendicular to a line connecting the notch 14 and the center of the wafer 10.

After formation of the orientation flat lines 16, the small-diameter wafers 12 are cut out from the large-diameter wafer 10 by driving the laser apparatus not shown. The small-diameter wafers 12 are cut out in a circular shape. It should be noted that the small-diameter wafers 12 are cut out to be slightly larger than the one-half inch size because they will be finished so as to have the required outside diameter by grinding their edge through a later outside diameter finishing step.

For the laser apparatus, a publicly known apparatus as shown in the Patent Literature 1 can be used. The laser apparatus is mounted on a publicly known X-Y drive apparatus to be freely movable in a horizontal plane. The formation pattern of the orientation flat lines 16 and the cutout pattern of the small-diameter wafers 12 are prestored in the control unit. The control unit moves and drives the laser apparatus according to a given program to form the orientation flat lines 16 and cut out the small-diameter wafers 12.

The large-diameter wafer 10 is held on a publicly known vacuum chuck (not shown) as shown in the Patent Literature 1. In fact, the vacuum chuck supports, with its ring-shaped supports, the lower surface side of the large-diameter wafer 10 at portions each corresponding to each wafer 12 of the small-diameter wafers 12 to be cut out, and suctions the air within these ring-shaped supports by means of a vacuum apparatus. Thus, it sucks and supports the lower surfaces of the portions of the respective wafers 12. In addition, the periphery of the large-diameter wafer 10 may also be held by the vacuum chuck. Sucking and supporting the large-diameter wafer 10 by means of the vacuum chuck in this way allows formation of the orientation flat lines 16 and cutting and separation of the individual small-diameter wafers 12.

As described above, by lapping the large-diameter wafer 10 in advance so as to reduce its thickness down to about 350 µm, it is possible to easily cut out the small-diameter wafers 12 by a laser beam.

The laser beam is not limited to any particular type, though a YAG laser is preferable.

Additionally, in regard to the laser apparatus, it is preferable to use a laser apparatus having water jet orifices that produce a ring-like water jet around a laser beam emitted from the laser beam radiation aperture (laser processing in water). During formation of the orientation flat lines 16 by a laser beam, and during cutout of the small-diameter wafers 12, the water jetting makes it possible to cool down the wafer 10 heated to high temperature due to the laser beam irradiation, and to remove resulting cutting debris by water.

An example of the size of the small-diameter wafers 12 is shown below.

The outside diameter of the small-diameter wafers 12 is 12.5 mm, the diameter of the flat portion is 12.25 mm, and the width of the beveled portion 18 in the outer periphery (edge) is 0.125 mm.

The orientation flat lines 16 are positioned 5.75 mm away from the center of the wafer 12, with a width of 50 µm and a depth of 5 to 25 µm. These dimensions are not limited to any particular ones. However, the depth of the orientation flat lines 16 as formed by laser processing is set at a depth (50 µm) which will not wear out after the etching step, the polishing step, and various processing steps in formation of the semiconductor device.

Figure 3:
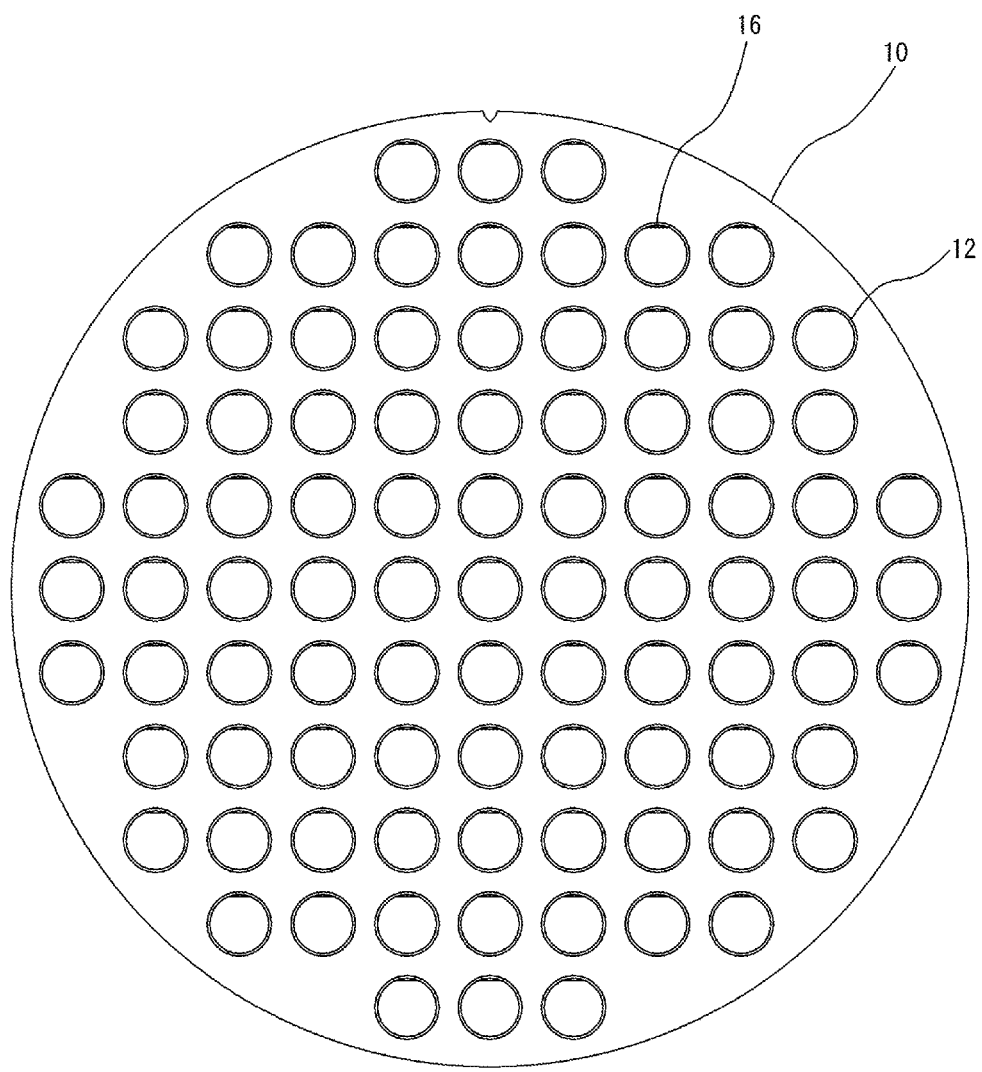
FIG. 3 is a plan view showing an example of a cutout pattern of small-diameter wafers in an actual large-diameter wafer with a 200 mm diameter.

FIG. 3 shows an example of a cutout pattern of the small-diameter wafers 12 in an actual 200 mm large-diameter wafer 10. Cutout of 129 pieces of small-diameter wafers 12 can be performed. Of course, the small-diameter wafers 12 on an area with a crystal defect are discarded.

The above-described cut out small-diameter wafers 12 are finished into a wafer by the following steps.

1) Outside Diameter Finishing Step

The above-described cut out wafers 12 are ground with a diamond grinding stone, etc. so as to adjust the outside diameter thereof to one-half inch size. As there is cutting debris left on the outer edge of the wafers 12 cut out by a laser beam, the cutting debris can also be removed by this outside diameter finishing step in addition to adjustment of the outside diameter. The outside diameter could be machined within an accuracy of 12.5 mm+0.1 mm.

2) Beveling Step

The above-described wafers 12 with the finished outside diameter are polished with a grinding stone to perform beveling work of their outer periphery. The beveling work was also able to be performed without problems because the orientation flat lines 16 had been provided in the surface of the wafers 12.

It should be noted that the beveling work is performed using a diamond grinding stone whose grinding surface is formed in a concave shape, and therefore, the above-described outside diameter finishing step and this beveling step may be performed at the same time with the same grinding stone by means of a special beveling apparatus (not shown).

3) Etching Step

Next, the wafers 12 are etched in order to remove a layer that suffered machining damage when the large-diameter wafer 10 was thinned by lapping, as well as grits embedded therein. An alkali (KOH-based solution) or an acid (fluonitric acid-based solution) is used as an etchant. The removal depth shall be about 10 to 50 µm.

4) Mirror Beveling Step

The beveled portion 18 was mirror-finished using a finishing grinding stone. This can prevent dust emission during the assembly and testing process.

5) Polishing (CMP) Step

Next, CMP processing is performed as with the conventional large-diameter wafers.

This polishing is performed through multiple substeps as necessary. For example, the primary polishing aims at making a smooth-mirrored surface with high efficiency by means of a double side polishing apparatus. Polishing accuracy of 0.27 mm±10 µm in thickness was achieved.

The secondary polishing aims at eliminating OSFs (Oxidation-induced Stacking Faults) and improving the surface roughness. The tertiary or quaternary polishing aims at eliminating hazes and contaminations. Every stage uses an appropriate polishing liquid. It should be noted that the polishing step may include multiple substeps as necessary depending on the finishing accuracy, and thus may include only a primary polishing by means of a double side polishing apparatus and a final polishing by means of a single side polishing apparatus.

6) Precision Cleaning Step

Finally, the wafers contaminated through polishing, etc. are cleaned up by conventional RCA cleaning. Residues such as metal impurities and particles are removed. The cleaning liquid is circulated with the liquid being cleaned through a filter, and with additional temperature control. Additional application of ultrasound enhances the level of cleaning.

As described above, the finishing step of the wafers can be performed.

In addition, it should be noted that, when aligning the wafers in the semiconductor manufacturing steps, the wafers 12 can be easily aligned with the aid of identification of both ends of the orientation flat lines 16 that reach the edge of the wafers as the direction of the orientation flat lines 16 by means of a sensor, etc.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention has been described in detail, it should be understood that the various changes, substitutions, and alternations could be made hereto without departing from the spirit and scope of the invention.

What is claimed is:

1. A method of manufacturing semiconductor wafers, in which a plurality of small-diameter wafers is cut out from a large-diameter semiconductor wafer, the method comprising the following steps:

a marking step of forming straight groove-like orientation flat lines by a laser beam so as to cross the respective small-diameter wafers in each row in the large-diameter semiconductor wafer, wherein cutout positions of the small-diameter wafers are aligned in rows in a specific direction, collectively for each of the rows; and a cutting step of cutting out the small-diameter wafers separately from the large-diameter semiconductor wafer by a laser beam, after the marking step, in such a way that the orientation flat lines are located at required positions in the small-diameter wafers to be obtained;

an outside diameter finishing step of finishing the cut out small-diameter wafer so as to have a required outside diameter;

a beveling step of beveling an outer periphery of the small-diameter wafer into a predefined shape;

an etching step of etching the beveled small-diameter wafers;

a mirror beveling step of mirror processing a beveled portion of the beveled small-diameter wafer, using a finishing grinding stone;

a polishing step of mirror processing the mirror-beveled small-diameter wafers; and a precision cleaning step of cleaning the wafers contaminated through polishing.

2. The method of manufacturing semiconductor wafers according to claim 1, wherein the outside diameter finishing step and the beveling step are performed at the same time with the same grinding stone using a beveling apparatus.

3. A method of manufacturing semiconductor wafers, in which a plurality of small-diameter wafers is cut out from a large-diameter semiconductor wafer, the method comprising the following steps:

a marking step of forming straight groove-like orientation flat lines by a laser beam so as to cross the respective small-diameter wafers in each row in the large-diameter semiconductor wafer, wherein cutout positions of the small-diameter wafers are aligned in rows in a specific direction, collectively for each of the rows;

a cutting step of cutting out the small-diameter wafers separately from the large-diameter semiconductor wafer by a laser beam after the marking step;

an outside diameter finishing step of finishing the cut out small-diameter wafer so as to have a required outside diameter;

a beveling step of beveling an outer periphery of the small-diameter wafer into a predefined shape;

an etching step of etching the beveled small-diameter wafers;

a mirror beveling step of mirror processing a beveled portion of the beveled small-diameter wafer, using a finishing grinding stone;

a polishing step of mirror processing the mirror-beveled small-diameter wafers; and a precision cleaning step of cleaning the wafers contaminated through polishing.

4. The method of manufacturing semiconductor wafers according to claim 3, having a lapping step of lapping the large-diameter semiconductor wafer so as to have a required thickness, wherein the marking step and subsequent steps are performed after the lapping step.

5. The method of manufacturing semiconductor wafers according to claim 3, wherein the straight groove-like orientation flat lines are formed so that both ends thereof reach an edge of the small-diameter wafers to be cut out.

6. The method of manufacturing semiconductor wafers according to claim 4, wherein the straight groove-like orientation flat lines are formed so that both ends thereof reach an edge of the small-diameter wafers to be cut out.

7. The method of manufacturing semiconductor wafers according to claim 3, wherein positions of the straight orientation flat lines are determined based on an orientation flat or a notch of the large-diameter semiconductor wafer.

8. The method of manufacturing semiconductor wafers according to claim 4, wherein positions of the straight orientation flat lines are determined based on an orientation flat or a notch of the large-diameter semiconductor wafer.

9. The method of manufacturing semiconductor wafers according to claim 5, wherein positions of the straight orientation flat lines are determined based on an orientation flat or a notch of the large-diameter semiconductor wafer.

10. The method of manufacturing semiconductor wafers according to claim 6, wherein positions of the straight orientation flat lines are determined based on an orientation flat or a notch of the large-diameter semiconductor wafer.

11. The method of manufacturing semiconductor wafers according to claim 3, wherein one-half inch size small-diameter wafers are cut out.

12. The method of manufacturing semiconductor wafers according to claim 3, wherein the outside diameter finishing step and the beveling step are performed at the same time with the same grinding stone using a beveling apparatus.

* * * * *